United States Patent [19]
Li et al.

[11] Patent Number: 5,439,731
[45] Date of Patent: Aug. 8, 1995

[54] INTERCONNECT STRUCTURES CONTAINING BLOCKED SEGMENTS TO MINIMIZE STRESS MIGRATION AND ELECTROMIGRATION DAMAGE

[75] Inventors: Che-Yu Li; Peter Borgesen; Matt A. Korhonen, all of Ithaca

[73] Assignee: Cornell Research Goundation, Inc., Ithaca, N.Y.

[21] Appl. No.: 208,598

[22] Filed: Mar. 11, 1994

[51] Int. Cl.$^6$ ................................................ B32B 9/00
[52] U.S. Cl. ..................................... 428/209; 257/750; 257/762; 257/763; 257/764; 257/767; 257/771; 174/126.2; 174/261
[58] Field of Search ............... 257/750, 762, 763, 764, 257/767, 771; 428/209

[56] References Cited

U.S. PATENT DOCUMENTS

| | | | |
|---|---|---|---|
| 3,780,426 | 12/1973 | Ono et al. | 257/750 |
| 4,107,726 | 8/1978 | Schilling | 357/71 |
| 4,166,279 | 8/1979 | Gangulee et al. | 357/71 |
| 4,352,239 | 10/1982 | Pierce | 29/590 |
| 4,424,251 | 1/1984 | Sugishita et al. | 428/201 |
| 4,438,450 | 3/1984 | Sheng et al. | 357/68 |
| 4,508,749 | 4/1985 | Brannon et al. | 427/43.1 |
| 4,524,378 | 6/1985 | Cockrum et al. | 357/71 |
| 4,725,877 | 2/1988 | Brasen et al. | 357/209 |
| 4,774,127 | 9/1988 | Reagan et al. | 428/71 |
| 4,782,380 | 11/1988 | Shankar et al. | 357/71 |
| 4,786,962 | 11/1988 | Koch | 357/71 |
| 4,816,895 | 3/1989 | Kikkawa | 357/71 |
| 4,824,716 | 4/1989 | Yerman | 428/209 |
| 4,824,803 | 4/1989 | Us et al. | 437/192 |
| 4,841,354 | 6/1989 | Inaba | 357/71 |
| 4,884,118 | 11/1989 | Hui et al. | 357/45 |
| 4,884,120 | 11/1989 | Mochizuki et al. | 357/68 |
| 4,970,574 | 11/1990 | Tsunenari | 357/71 |
| 5,001,541 | 3/1991 | Virkus et al. | 357/68 |
| 5,008,730 | 4/1991 | Huang et al. | 357/68 |
| 5,252,382 | 10/1993 | Li | 428/209 |
| 5,291,066 | 3/1994 | Neugebauer et al. | 257/750 |

OTHER PUBLICATIONS

Hey, H. P. W. et al., "Selective Tungsten on Aluminum for Improved VLSI Interconnects", IEDM 86, pp. 50–53, 1987.

Jackson, M. S. et al., "Stress Relaxation and Hillock Growth in Thin Films", Acta Metall., vol. 30, pp. 1993–2000, 1982.

Puttlitz, A. F. et al., "Semiconductor Interlevel Shorts Caused by Hillock Formation in Al–Cu Metallization", IEEE, vol. 12, No. 4, pp. 619–626, 1989.

*Primary Examiner*—Patrick J. Ryan
*Assistant Examiner*—Kam F. Lee
*Attorney, Agent, or Firm*—Jones, Tullar & Cooper

[57] ABSTRACT

Interconnect or metallization structures for integrated circuits on semiconductor chips contain blocked conductor segments to limit atomic transport from one segment to another thus minimizing stress migration and electromigration damage. Since the blocked conductor segments prevent atomic transport between two neighboring segments, the total amount of atoms and vacancies available for hillock and void growth in a segment can be controlled by the length of the segment. The conductor segments are made of high electrical conductance metals, such as aluminum, copper or gold based alloys, and are separated by very short segments of a high melting temperature refractory metal or alloy. Because of their high melting temperatures, refractory metals or alloys suppress atomic transport. The interconnect structures can be fabricated by conventional lithographic and deposition techniques.

11 Claims, 1 Drawing Sheet

INTERCONNECT STRUCTURES CONTAINING BLOCKED SEGMENTS TO MINIMIZE STRESS MIGRATION AND ELECTROMIGRATION DAMAGE

BACKGROUND OF THE INVENTION

The present invention relates in general to interconnect or metallization structures for integrated circuits on a semiconductor chip wherein blocked segments of good electrical conductors are formed in the interconnects to minimize void or hillock growth produced by stress migration and electromigration damage.

The metallization systems used in integrated circuits on a semiconductor chip often include several levels of narrow and thin metal interconnects which are separated by insulator or passivation layers and are connected by vias through the same. More particularly, narrow and thin metal interconnects are deposited on an insulator layer that covers the semiconductor chip and are connected to the underlying devices in the chip through holes or vias drilled through the insulator layer. The interconnects are covered by a passivation layer for corrosion and electromigration resistance.

Stress migration and electromigration damage can both occur in the form of voids and hillocks. The former increase the resistance of the metal lines that make up an interconnect and may eventually sever the interconnect. In severe cases, the latter fracture the passivation layers and produce shorts between neighboring interconnects. The fracture of passivation layers will also expose the metal interconnects to the external environment which is corrosive.

Stress migration is caused by thermal stresses produced by the mismatch between the coefficients of thermal expansion of the metal interconnect and its surrounding passivation and insulator layers. Depending on prior thermal history, the thermal stresses can either be tensile or compressive. Void formation is associated with tensile stresses while hillock growth is associated with compressive stresses.

Thermal stress induced voids participate in the electromigration damage processes in ways depending on their sizes. When the sizes of these voids are large, they migrate under electrical currents without being trapped by barriers such as grain boundaries. When the size of these voids are small, they are first trapped at grain boundaries and other barriers and grow through electrical current induced atomic transport until they are sufficiently large to free themselves from the barriers. Migrating voids coalesce with other voids and thus provide an effective way for void growth. Independently of the mechanism of void growth, continued void growth will eventually sever an interconnect.

Another consequence of electrical current induced atomic transport is hillock growth. Under the influence of a high electrical current, atoms will move preferentially in one direction while vacancies (empty atomic sites) will move in the opposite direction. The excess vacancies are collected by voids. Correspondingly the excess atoms are collected by hillocks which are protrusions made of migrated atoms.

In the case when thermal stress induced voids are absent in a metal interconnect, the electrical current induced atomic transport discussed above will produce high tensile stresses at locations where excess vacancies are accumulated. Such high tensile stresses are believed to cause the nucleation of voids that participate in the electromigration damage processes in the same way as small and trapped thermal stress induced voids.

To improve electromigration damage resistance, a variety of approaches are being practiced. Notable among these are those relying on alloying additions and those relying on backup refractory metal or alloy layers.

An example of such an approach is the addition of a few percent of copper to aluminum interconnects. It is believed that the benefits of copper addition are derived from the decreased rate of atomic transport, which slows down void and hillock growth, and from the formation of second phase precipitates that trap moving voids. However, although copper and similar alloying additions have been shown to be beneficial, electromigration induced damage will ultimately cause failures in metal interconnects.

The use of backup layers of tungsten, titanium or their alloys under and/or on top of an aluminum based layer are examples of the second approach mentioned above. These backup layers provide electrical continuity when the aluminum based layer fails because of stress migration and/or electromigration damage. The high melting temperatures of the refractory metals or alloys are the reason for their immunity to stress migration and electromigration damage. However, their high resistances prevent the use of them for the primary conducting layer as well. For the same reason the resistance of the interconnect increases when the primary, aluminum based conductor fails.

U.S. Pat. No. 5,252,382 to Li discloses the use of patterned interfaces between the metal interconnect and its surrounding passivation and insulation layers as a method of minimizing or eliminating stress migration damage. The stress state in a passivated metal interconnect is here altered by the presence of patterned interfaces which contain regions of good adhesion and regions of poor adhesion. Thus the nucleation and growth of voids and hillocks are suppressed. It is believed that patterned interfaces will also improve electromigration resistance by limiting the current induced stress build-up.

SUMMARY OF THE INVENTION

The present invention provides yet another interconnect structure in which stress migration and electromigration induced damages are substantially reduced or eliminated. In particular, the present invention employs interconnects that contain segments of high electrical conductance electrical conductors, each of which are blocked at both ends by short segments of high melting temperature metals (refractory metals or alloys), through which atomic transport is suppressed. The length of the latter is optimized for ease of fabrication and low electrical resistance. The length of the former is optimized for limited void or hillock growth and also for ease of fabrication.

The concept of blocked segments, on which the present invention is based, can be illustrated as follows: Consider a segment of aluminum interconnect of dimensions 5 $\mu m \times 0.5 \mu m \times 0.5 \mu m$, which is blocked from the neighboring segments at either end, so that atomic transport is prevented. The maximum possible size of a void or hillock within this segment will depend on the state of stress in the segment, whether thermally or electromigration induced. If the line was passivated at 400° C., the thermal stresses in the metal at room temperature would be completely eliminated by the time the resulting voids occupy about 2% of the total volume. The application of a typical (service) current is not likely to increase the total void volume considerably, and void coalescence is confined to within the individual blocked segments. Since line severance is typically caused by an 0.2 $\mu$m wide (or wider) void extending across the entire line, corresponding to about 4% of the metal volume in a 5 $\mu$m long segment, the integrity of the above blocked segment is ensured.

Except for the blocking segments, the metallization or interconnect structure of the present invention can be fabricated in the conventional way. The choice of high conductance electrical conductors includes aluminum, copper and gold based alloys. The short blocking segments can be made of metals and alloys currently used for backup layers, such as tungsten, titanium, and their alloys or other refractory metals and alloys. In fact when the short blocking segments are connected to such backup layers, good electrical contact is ensured between the segment of the high conductance electrical conductor and the short blocking segment.

The short blocking segments of a refractory metal or alloy can be fabricated in the similar way as tungsten plugs, which are currently used as vias connecting one level of interconnect to another. The choice of high melting temperature metals or alloys can favor the formation of intermetallic compounds between the refractory metals or alloys and the metals or alloys of good electrical conductors, provided that these intermetallic compounds also have high melting temperatures.

Another possibility is to produce a short blocking segment that connects a backup layer under a segment of a good electrical conductor to a backup layer on top of the next segment of a good electrical conductor.

BRIEF DESCRIPTION OF THE DRAWINGS

The objects, features and advantages of the present invention will become apparent from the following detailed description of preferred embodiments thereof, taken in conjunction with the accompanying drawings in which.

DETAILED DESCRIPTION OF THE PREFERRED EMBODIMENTS

Figure 1:
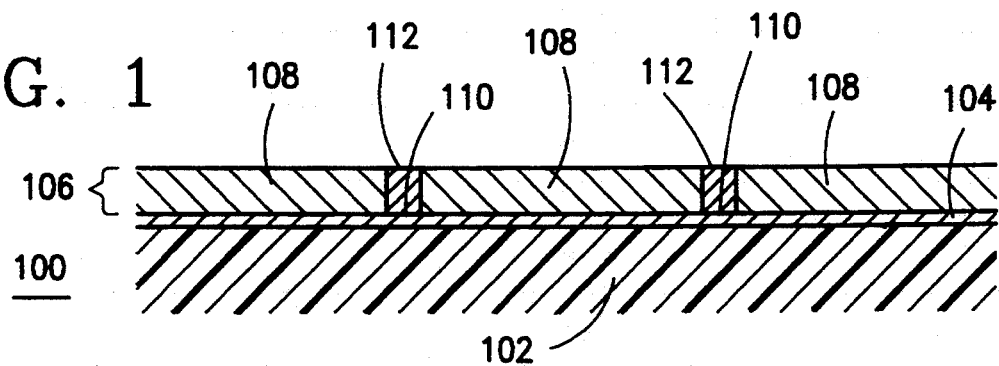
FIG. 1 is a longitudinal cross sectional view of an interconnect structure constructed in accordance with a first preferred embodiment of the present invention.
Figure 2:
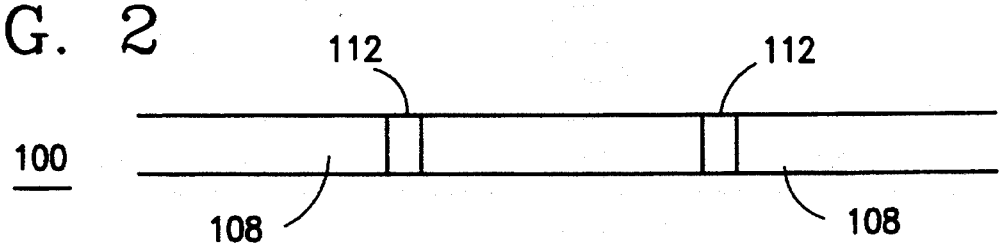
FIG. 2 is a top view of the structure of FIG. 1.

Turning now to a more detailed consideration of two preferred embodiments of the present invention, FIGS. 1 and 2 illustrate a metal interconnect structure 100 which forms a first preferred embodiment. The interconnect structure 100 comprises a conventional substrate 102, which can be a passivation layer for the conductors of another layer below or an insulation layer on top of a silicon chip. A high melting temperature metal back-up layer 104 is formed over the substrate 102 using any suitable conventional technique, and is preferably made of tungsten and titanium alloys, or other refractory metals or alloys of high melting temperature.

Formed over the back-up layer 104 is a metal interconnect 106 comprising a plurality of high electrical conductance conductor segments 108 which are preferably formed of aluminum, copper or gold based alloys and are fabricated in any suitable conventional manner, such as by dry etching or using lift off technology. Each of the high conductance conductor segments 108 is separated by a small opening 110 which can be made using conventional lithographical methods. Each of the openings 110 is filled with a short segment 112 of high melting temperature metal which is preferably the same refractory metal or alloy used to make the back-up layer 104. This can also be accomplished by conventional lithographic methods.

The short segments 112, since they are formed from high melting temperature material, act to block atomic transport between the high conductance segments 108. The length of the short segments 112 is chosen to be as small as possible to minimize line electrical resistance so that in spite of the relatively high resistance of the material forming the short segments 112, current can still flow relatively freely through them between the high conductance segments 108. However, current fabrication technologies limit how small the length of the short segments 112 can be and so their length must also be chosen based upon the ease of fabrication. With current technology, a length of approximately 0.1 microns ($\mu$m) is the approximate preferred length for the short segments 112 with the range of lengths being from about 0.01 micron to 1.0 micron.

The length of the high conductance segments 108 is chosen also for ease of fabrication and to minimize stress migration and electromigration damage by limiting the amount of vacancies for voids and atoms or hillocks. In general, stress and damage related failure may be prevented by keeping the lengths of the high conductance segments 108 sufficiently small. On the other hand, the average conductance of a line is optimized by keeping these lengths as large as possible. In this sense, there thus exists an optimum segment length. However, this length depends on the residual thermal stress, and thus on annealing/passivation temperature and type of passivation employed during fabrication. It also depends on the electrical current to be sustained, although this contribution is often negligible. Generally, the optimum length decreases with decreasing service temperature and increasing passivation temperature and current. Furthermore, even for slightly larger segment lengths, reliability is still somewhat improved. In the absence of other factors, the preferred length of the high conductance segments 108 is approximately 5 microns if the line is to be passivated with a rigid ceramic layer at 400° C. For lower passivation temperatures, the segments may be longer, as the optimum length is inversely proportional to the difference between the passivation temperature and the room temperature. In practice, a range of approximately 5 to 20 microns should be suitable for the length of the high conductance segments 108.

Figure 3:
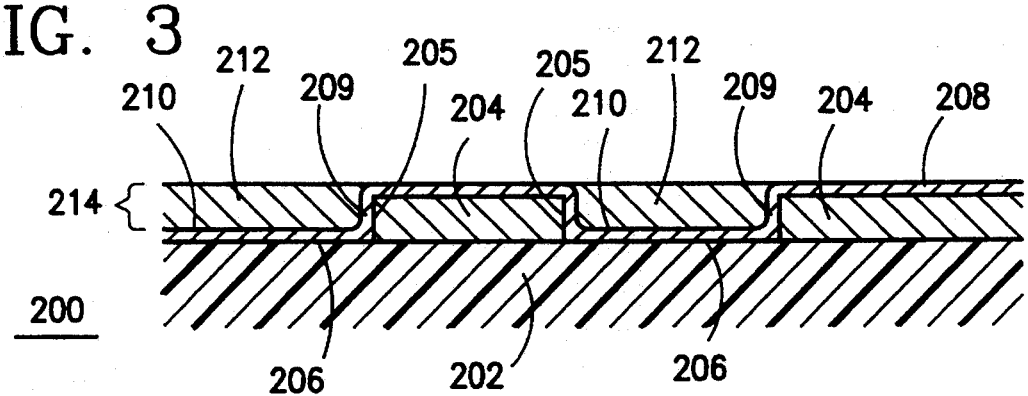
FIG. 3 is a longitudinal cross sectional view of an interconnect structure constructed in accordance with a second preferred embodiment of the present invention; and, FIG. 4 is a top view of the structure of FIG. 3.
Figure 4:
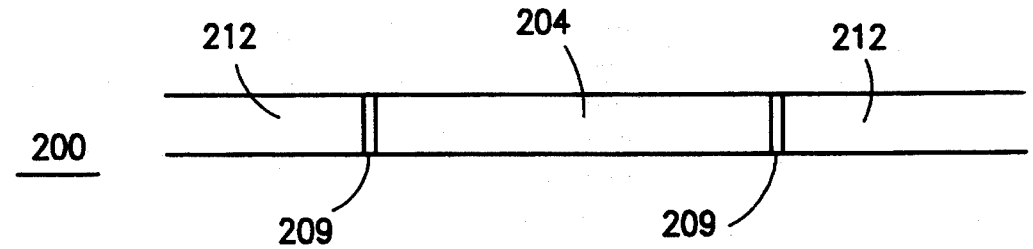

A second preferred embodiment of the present invention is illustrated in FIGS. 3 and 4. In particular, a metal interconnect structure 200 is shown which includes a substrate 202 on which is disposed, a first plurality of spaced high electrical conductance metal segments 204, each having first and second vertical sides 205. A plurality of corresponding gaps 206 are formed between each of the metal segments 204. Formed over the first plurality of high conductance segments 204 and the gaps 206 is a conformal back-up layer 208, which has a zigzag cross section as illustrated. The back-up layer 208 is formed from the same high melting temperature metal as the back-up layer 104 in the interconnect structure 100 of FIGS. 1 and 2. The back-up layer 208 includes a plurality of vertical portions 209, one adjacent each of said vertical sides 205 of said segments 204.

A plurality of troughs 210 are formed above the regions of the back-up layer 208 which cover the gaps 206. A second plurality of high electrical conductance metal segments 212 is then deposited one in each of the troughs 210, between and contacting adjacent ones of said vertical portions 209.

The first and second plurality of high electrical conductance segments 204 and 212, and the plurality of vertical portions 209 of said back-up layer 208 therefore form a metal interconnect 214 on said substrate 202. Each of the vertical portions 209 of the back-up layer 208 act as a barrier which block atomic transport between the adjacent first and second plurality of high conductance segments 204 and 212, but still allow appreciable current to flow through the adjacent segments. The thickness of the back-up layer 208, and therefore vertical portions 209, is preferably approximately 0.1 micron, but can be anywhere in the range of approximately 0.01 microns to 1.0 micron. As with the embodiment of FIGS. 1 and 2, the length of the high conductance segments 204 and 212 is chosen for ease of fabrication and to minimize stress migration and electromigration damage by limiting the amount of vacancies for voids and atoms for hillocks and again, is preferably in the range of approximately 5–20 microns.

It will be understood to those of skill in the art that any conventional passivation method can be used with either of the preferred embodiments of the present invention so that the resulting metallization structure will contain metal lines surrounded by passivation or insulator layers. The structures can be stacked so that a metallization structure can be formed containing several levels of metal lines.

Although the invention has been disclosed in terms of preferred embodiments, it will be understood that numerous other variations and modifications could be made thereto without departing from the scope of the invention as set forth in the following claims.

What is claimed is:

1. A metal interconnect structure comprising:
   an insulating substrate;
   a first plurality of spaced, electrically conductive metal segments formed on said substrate, each having a pair of vertical sides and being separated by a plurality of corresponding gaps between adjacent ones of said first plurality of segments;
   a refractory metal back-up layer conformally formed over said first plurality of electrically conductive metal segments and said plurality of gaps, wherein said back-up layer includes a plurality of vertical portions adjacent each said vertical side of said first plurality of segments, and a plurality of troughs are formed above said backup layer and said gaps between adjacent ones of said vertical portions; and,
   a second plurality of electrically conductive metal segments formed in said troughs between and contacting said vertical portions;
   wherein, said first and second plurality of electrically conductive segments and said plurality of vertical portions of said refractory metal back-up layer form a metal interconnect, and wherein each segment in said first and second plurality of segments has a length which minimizes stress migration and electromigration damage by limiting the amount of vacancies for voids and atoms for hillocks, and each said vertical portion of said refractory metal back-up layer has a width which enables said vertical portion to block atomic transport between adjacent ones of said first and second plurality of electrically conductive segments, while at the same time minimizing electrical resistance through each said vertical portion.

2. The interconnect structure of claim 1, wherein said back-up layer is formed from refractory metals or their alloys.

3. The interconnect of claim 2, wherein said refractory metals or their alloys are chosen from the group comprising tungsten, titanium and their alloys.

4. The interconnect structure of claim 2, wherein said first and second plurality of electrically conductive segments are formed from metals chosen from the group comprising aluminum, copper or gold based alloys.

5. The interconnect structure of claim 1, wherein each of said plurality of vertical portions has a width in the range of approximately 0.01 micron to 1.0 micron, and each of said first and second pluralities of high electrical conductance metal segments has a length in the range of approximately 5 to 20 microns.

6. A metal interconnect structure comprising:
   an insulating substrate; and,
   at least one metal interconnect formed on said substrate comprising:
   a plurality of electrically conductive spaced metal segments formed on said substrate;
   a plurality of gaps formed, one each, between adjacent ones of said plurality of electrically conductive segments; and
   a plurality of refractory metal segments positioned, one each, in said gaps, and in contacting relationship with adjacent ones of said electrically conductive segments, said refractory metal segments acting to block atomic transport between adjacent ones of said electrically conductive segments while still allowing electrical current to flow through adjacent ones of said electrically conductive segments.

7. The interconnect structure of claim 6, wherein said electrically conductive segments are formed of metals selected from the group comprising aluminum, copper or gold based alloys.

8. The interconnect structure of claim 6, further comprising a back-up refractory metal layer disposed between said substrate and said at least one metal interconnect.

9. The interconnect structure of claim 13, wherein said electrically conductive metal segments each have a length in the range of approximately 5 to 20 microns and each of said plurality of refractory metal segments has a length in the range of approximately 0.01 micron to 1.0 micron.

10. The interconnect structure of claim 6, wherein said refractory metal segments are formed from refractory metals or their alloys.

11. The interconnect structure of claim 10, wherein said refractory metal segments are formed from metals selected from the group comprising tungsten, titanium and their alloys.

* * * * *

UNITED STATES PATENT AND TRADEMARK OFFICE
CERTIFICATE OF CORRECTION

PATENT NO. : 5,439,731
DATED : August 8, 1995
INVENTOR(S) : CHE-YU LI

It is certified that error appears in the above-indentified patent and that said Letters Patent is hereby corrected as shown below:

On the cover page, under [73] Assignee, "Cornell Research Goundation, Inc." should read --Cornell Research Foundation, Inc.--.

Signed and Sealed this

Twenty-sixth Day of September, 1995

Attest:

BRUCE LEHMAN

*Attesting Officer*  *Commissioner of Patents and Trademarks*